(12) United States Patent
Nurmi

(10) Patent No.: US 6,283,066 B1
(45) Date of Patent: Sep. 4, 2001

(54) CONTINUOUS GAS SATURATION SYSTEM AND METHOD

(75) Inventor: Douglas B. Nurmi, McKinney, TX (US)

(73) Assignee: Air Liquide America Corporation, Houston, TX (US)

( * ) Notice: Subject to any disclaimer, the term of this patent is extended or adjusted under 35 U.S.C. 154(b) by 0 days.

(21) Appl. No.: 09/570,940

(22) Filed: May 15, 2000

Related U.S. Application Data

(62) Division of application No. 09/251,744, filed on Feb. 18, 1999, now Pat. No. 6,135,433.
(60) Provisional application No. 60/076,294, filed on Feb. 27, 1998.

(51) Int. Cl.[7] ............................................. F22B 1/00
(52) U.S. Cl. .............................. 122/4 R; 165/61; 165/64
(58) Field of Search ............................... 122/4 R; 165/61, 165/64

(56) References Cited

U.S. PATENT DOCUMENTS

| | | | |
|---|---|---|---|
| 3,323,578 | * | 6/1967 | Hermann ................................. 165/64 |
| 4,212,663 | | 7/1980 | Aslami . |

FOREIGN PATENT DOCUMENTS

| | | |
|---|---|---|
| 1 644 008 | 6/1967 | (DE) . |
| 0 479 375 | 4/1992 | (EP) . |
| 04-362093 | 12/1992 | (JP) . |
| 06-196415 | 7/1994 | (JP) . |

OTHER PUBLICATIONS

Price for two Equillbrium Composition Evaporators (Bubblers) Sep. 13, 1996.*
Alloy Products Corp. Quotation #00733, Oct. 8, 1996.*
Lexington Group International Inc., Lump Sum Price For One Bubbler, Contract No. 183, Jun. 11, 1996.*
Universal Industries Services, Invoice No. 96–0014, May 23, 1996.*
Universal Industries Services, Invoice No. SP6250506, May 28, 1996 (4 pages).*
Lexington Group International, Contract No. 03217.001, Universal Invoice for Partial Payment of the TCS Storage Tank, Shop Drawings, Jul. 3, 1996.*
Air Liquide Electronics, Statement of Requirements for Gas Dispersion Vessel.*
Lexington Group International, Inc., Letter dated Jun. 13, 1996 to Doug Nurmi, Project Manager, Air Liquide from James Knight, Project Manger, LGT regarding Contract No. 03.217.01.*
Lexington Group International, Inc., Conference Notes from the May 30, 1996 meeting (LGI correspondence #14), May 31, 1996.*

(List continued on next page.)

*Primary Examiner*—Jiping Lu
(74) *Attorney, Agent, or Firm*—Burns, Doane, Swecker & Mathis, L.L.P.

(57) ABSTRACT

Provided is a system for controlled vaporization of a liquid chemical. The system includes: (a) an evaporation vessel connected to receive a liquid chemical which is carrier gas free; (b) a mechanism for maintaining the liquid chemical in the evaporation vessel at a substantially constant level; and (c) a mechanism for controlling the temperature of the liquid chemical in the evaporation vessel to a desired value, the controlling mechanism including: (I) a system for cooling the liquid chemical, and (II) a heater inside the evaporation vessel for heating the liquid chemical. Also provided, are methods of controlled delivery of a vaporized liquid chemical. The above systems and methods are particularly applicable to the semiconductor manufacturing industry.

10 Claims, 4 Drawing Sheets

OTHER PUBLICATIONS

Lexington Group International, Inc., Conference Notes from the May 23, 1996 meeting (LGI correspondence #13), May 31, 1996.*

Lexington Group International, Inc., Conference Notes from the May 14, 1996 conference, May 16, 1996.*

Lexington Group International, Inc., Contract No. 03.217.01 Notes from May 7, 1996 (LGI correspondence #12), May 10, 1996.

Lexington Group International, Inc., conference notes from the Apr. 30, 1996 meeting (LGI correspondence #11), May 1, 1996.

Air Liquide Electronics, Minutes from Apr. 3–4, 1996 HC1 and TCS Design Review.

Air Liquide Electronics, Mar. 26, 1996, Drawings of the Bubblers and Totes to be used in the MEMC TCS systems.

Air Liquide Electronics, Memorandum dated Apr. 3, 1996 regarding Design Considerations for Bulk TCS.

Air Liquide Electronics, Memorandum dated Apr. 3, 1996 regarding Design Considerations for Bulk HCI.

Air Liquide Electronics, Agenda dated Apr. 3, 1996 regarding MEMC Bulk Specialty Gas Design Review.

Air Liquide Electronics, Minutes dated Apr. 3–4, 1996 regarding MEMCSW Bulk Specialty Gas Design Review.

Air Liquide Electronics, Minutes regarding Apr. 3–4, 1996 HC1 and TCS Design Review dated Apr. 11, 1996.

Air Liquide Electronics, Mar. 26, 1996, Drawings of the Bubblers and Totes to be used in the MEMC TCS systems.

Lexington Group International, Inc., meeting notes from Mar. 12, 1996, Mar. 15, 1996.

Lexington Group International, Inc., vendor application and meeting notes from Mar. 19, 1996.

* cited by examiner

CONTINUOUS GAS SATURATION SYSTEM AND METHOD

CROSS-REFERENCE TO RELATED APPLICATIONS

This application is a divisional, of Application Ser. No. 09/251,744, filed Feb. 18, 1999, now U.S. Pat. No. 6,135,433 and claims priority under 35 U.S.C. §§119(e) and/or 365 to Provisional Application Ser. No. 60/076,294, filed Feb. 27, 1998.

BACKGROUND OF THE INVENTION

1. Field of Invention

The present invention relates to novel systems and methods for saturating a gas with a vapor from a liquid chemical. The invention also relates to novel systems and methods for controlled delivery of a vaporized liquid chemical. The invention has particular applicability to the semiconductor manufacturing industry.

2. Description of the Related Art

In the semiconductor manufacturing industry, high purity gases are supplied to process tools for carrying out various semiconductor fabrication processes. Examples of such processes include diffusion, chemical vapor deposition (CVD), etching, sputtering and ion implantation. The use of volatile liquids as the reactant source for these processes is known. Such liquids include, for example, silane ($SiH_4$), dichlorosilane ($SiH_2Cl_2$), trichlorosilane ($SiHCl_3$), ammonia ($NH_3$), boron trichloride ($BCl_3$), chlorine ($Cl_2$), hydrogen chloride (HCl) hydrogen fluoride (HF) and chlorine trifluoride ($ClF_3$).

To date, a number of methods have been used to provide a vaporized form of the volatile liquid chemical to the process equipment. These include methods of saturating a carrier gas with a vapor of the liquid chemical and of vaporizing the liquid chemical without a carrier gas. Known methods of saturating a carrier gas with a chemical vapor include, for example, direct injection of the liquid chemical directly into a carrier gas stream. It is also known to bubble a carrier gas through the liquid chemical thereby saturating the gas with the chemical vapor.

In carrier gas using methods, the concentration in the carrier gas of the chemical vapor is affected by several factors. For example, bubble size, in terms of bubble surface area, and time of exposure of the bubble to the liquid chemical affect the chemical vapor concentration in the carrier gas. A known device employed in contacting a liquid chemical with a carrier gas is a perforated tube extending into a container holding the liquid chemical. The carrier gas is bubbled into the liquid chemical through the perforations in the tube, which permit the gas to be distributed to a limited extent in the liquid. As the bubbling progresses and the liquid chemical vaporizes, the level of the liquid chemical in the container continuously falls in the absence of fresh liquid chemical being added thereto. This variation in liquid level during the bubbling process results in a reduction in the gas-liquid contact time, thereby altering the concentration of the chemical vapor in the carrier gas.

Another variable affecting the concentration of the chemical vapor in the carrier gas is the temperature of the liquid chemical. The vapor pressure of the volatile liquid chemical is a function of the temperature of the liquid chemical. Thus, at any given temperature the carrier gas becomes saturated with the chemical vapor at an equilibrium condition. The carrier gas and chemical vapor coexist at their equilibrium saturation conditions as long as the temperature remains constant. If, however, the temperature drops, a portion of the chemical vapor condenses from the vapor state, resulting in a change in the concentration of the chemical vapor in the carrier gas.

To control the temperature of the saturation device, it is conventional to use a chiller unit alone. In the conventional device, the chiller unit cools the system to a sub-ambient temperature to prevent condensation of the chemical vapor from the carrier gas as it is delivered to the process equipment. This, of course, assumes that en route to the process equipment, the gas is not subjected to a temperature lower than that at which the saturation occurred. It has been found, however, that a chiller unit alone does not provide complete temperature control.

During the saturation process, conversion of the liquid chemical to a vapor results in the removal of additional heat from the liquid. The net effect of this heat removal is that the temperature of the liquid chemical may drop below the control temperature of the coolant. Because the chiller unit only provides cooling duty, this additional heat removal cannot be compensated for by the cooling system alone. Thus, variations in the vapor pressure of the liquid chemical and concentration of the chemical vapor in the carrier gas can result.

Still another variable which can affect the chemical vapor concentration in the carrier gas is the pressure of the carrier gas. Known devices have made use of mechanical pressure regulators, which rely on springs and diaphragms to sense and control pressure. With such mechanical devices, however, there is an inherent delay in responding to system changes. This can result in pressure fluctuations which, in turn, produce variations in the chemical vapor concentration.

In carrier gas-free methods, changes in the vapor pressure of the liquid chemical result from variations in the liquid chemical temperature. Such variations bring about changes in the delivery pressure and flowrate of the product vapor to the semiconductor processing equipment, leading to process instabilities.

To meet the requirements of the semiconductor manufacturing industry and to overcome the disadvantages of the related art, it is an object of the present invention to provide novel systems for saturating a gas with a vapor from a liquid chemical. Through the invention, a gas which has a substantially constant chemical vapor concentration can be provided. This is achieved through control of the carrier gas pressure, the temperature of the liquid chemical and the liquid chemical level in the saturation vessel. The degree of control now possible with respect to the properties of the product gas has not been achieved with systems to date.

It is a further object of the invention to provide novel methods for saturating a gas with a vapor from a liquid chemical. The methods can be practices with the inventive systems.

It is a further object of the invention to provide novel systems for controlled delivery of a vaporized liquid chemical, which systems are carrier gas-free.

It is a further object of the invention to provide novel methods for controlled delivery of a vaporized liquid chemical, which methods are free of a carrier gas source.

Other objects and aspects of the present invention will become apparent to one of ordinary skill in the art on a review of the specification, drawings and claims appended hereto.

BRIEF DESCRIPTION OF THE DRAWINGS

The objects and advantages of the invention will become apparent from the following detailed description of the preferred embodiments thereof in connection with the accompanying drawings, in which like features are designated by like reference numerals, and in which.

SUMMARY OF THE INVENTION

Figure 1:
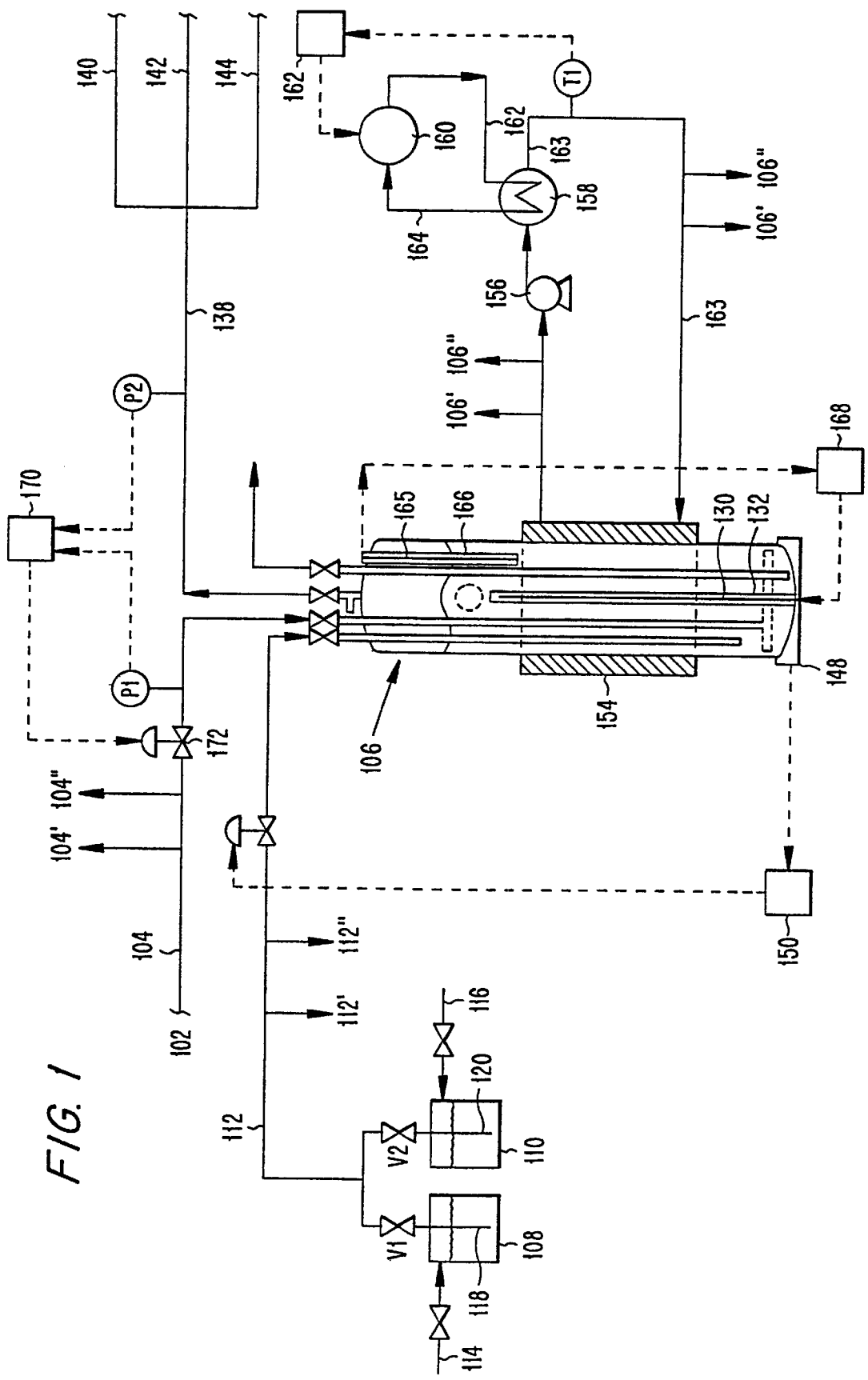
FIG. 1 illustrates an exemplary process flow diagram for gas saturation in accordance with one aspect of the invention.

The foregoing objectives are met by the systems and methods of the present invention. According to a first aspect of the invention, a system for saturating a gas with a vapor from a liquid chemical. The system comprises:

(a) a saturation vessel connected to receive a liquid chemical and a carrier gas;

(b) a gas sparger in the saturation vessel for sparging the carrier gas into the liquid chemical;

(c) means for maintaining the liquid chemical in the saturation vessel at a substantially constant level;

(d) means for controlling the temperature of the liquid chemical in the saturation vessel to a desired value, comprising (I) a system for cooling the liquid chemical, and (ii) a heater inside the saturation vessel extending vertically in the liquid a distance at least half of the height of the liquid chemical level for heating the liquid chemical; and (e) means for controlling the pressure of the saturated gas to a desired value.

In accordance with a further aspect of the invention, a method of saturating a gas with a vapor from a liquid chemical is provided. The method comprises the steps of:

(a) introducing a liquid chemical and a carrier gas into a saturation vessel, wherein the carrier gas is sparged into the liquid chemical to form a gas saturated with vapor from the liquid chemical;

(b) maintaining the liquid chemical in the saturation vessel at a substantially constant level;

(c) controlling the temperature of the liquid chemical in the saturation vessel to a desired sub-ambient value by cooling the liquid chemical to the desired value, and adding heat to the liquid chemical, as necessary to adjust the temperature, with a heater inside the saturation vessel, the heater extending vertically in the liquid a distance at least half of the height of the liquid chemical level; and (d) controlling the pressure of the saturated gas to a desired value.

A further aspect of the invention relates to a system for controlled vaporization of a liquid chemical. The system comprises:

(a) an evaporation vessel connected to receive a liquid chemical and which is carrier gas-free;

(b) means for maintaining the liquid chemical in the evaporation vessel at a substantially constant level; and (c) means for controlling the temperature of the liquid chemical in the evaporation vessel to a desired value, the controlling means comprising (I) a system for cooling the liquid chemical, and (ii) a heater inside the evaporation vessel for heating the liquid chemical.

In accordance with a further aspect of the invention, a method of controlled delivery of a vaporized liquid chemical is provided. The method is carrier gas-free and comprises the steps of:

(a) introducing a liquid chemical into an evaporation vessel;

(b) maintaining the liquid level in the evaporation vessel at a substantially constant level; and (c) controlling the temperature of the liquid chemical in the evaporation vessel to a desired sub-ambient value by cooling the liquid chemical to the desired value, and adding heat to the liquid chemical, as necessary to adjust the temperature, with a heater inside the saturation vessel; and (d) removing a stream of vaporized liquid chemical from the evaporation vessel.

DETAILED DESCRIPTION OF THE PREFERRED EMBODIMENTS OF THE INVENTION

The invention will now be described with reference to FIG. 1, which illustrates an exemplary process flow diagram for gas saturation in accordance with one aspect of the invention.

A carrier gas is delivered from a carrier gas source 102 through line 104 to a saturation vessel or bubbler 106, which contains a volatile liquid chemical. The carrier gas is bubbled through the liquid chemical in the saturation vessel 106 to form a saturated gas of desired concentration. The carrier gas source 102 can be, for example, a gas cylinder or a bulk storage vessel.

The specific carrier gas and liquid chemical employed will depend on the end use of the formed saturated gas. Typically, the carrier gas is hydrogen ($H_2$) or an inert gas such as helium (He), Argon (Ar) or nitrogen ($N_2$). Other reactive or non-reactive gases can also be used.

The liquid chemical employed in the present invention should be of sufficient volatility that a carrier gas bubbled therethrough can become saturated with the chemical vapor at sub-ambient temperatures and at concentrations which would make their use commercially feasible. Typical liquid chemicals employed in the semiconductor manufacturing industry which can be used with the invention include, but are not limited to, silane ($SiH_4$), dichlorosilane ($SiH_2Cl_2$), trichlorosilane ($SiHCl_3$), ammonia ($NH_3$), boron trichloride ($BCl_3$), chlorine ($Cl_2$), hydrogen chloride (HCl) hydrogen fluoride (HF) and chlorine trifluoride ($ClF_3$). The invention can be readily applied to other liquid chemicals.

Where the saturated gas is to be used in the manufacture of semiconductor devices, the carrier gas and liquid chemical should be of purities compatible with the devices being formed. Preferably, the carrier gas and liquid chemical are of ultra-high-purity.

A liquid supply system is provided which is capable of continuously introducing the liquid chemical into the saturation vessel 106. One or more liquid containers 108, 110 store a supply of the liquid chemical. The material of the containers should be compatible with the liquid chemical to prevent corrosion and avoid contamination of the chemical. A stainless steel such as 316L stainless steel can be used for this purpose.

Liquid containers 108, 110 are connected through a system of tubing and valves to allow the liquid chemical to be introduced into the saturation vessel 106. The tubes used to transport the liquid chemical through the system are preferably flexible hoses constructed of Teflon lined stainless steel. Containers 108, 110 can be connected to the saturation vessel by individual lines which converge into a single line 112. Optionally, one or more additional saturation vessels can be supplied with the liquid chemical via branch lines 112', 112".

Liquid containers 108, 110 are preferably configured to permit the liquid surface thereof to be pressurized with an inert gas, for example, through lines 114, 116, thereby forcing the liquid up through dip tubes 118, 120 and through the valve/piping system into the saturation vessel. Other flow configurations, for example, using a pump, are known in the art and can optionally be used.

By employing a plurality of liquid containers 108, 110, a continuous stream of the liquid chemical can be provided to the saturation vessel 106. The supply from first liquid container 108 can continue until the liquid chemical therein is depleted or until a predetermined, residual amount of the liquid remains in container 108. The liquid level in each of the containers is preferably monitored by a low level sensor connected either to an alarm system set up for manual operation of shutoff valves V1, V2 or, alternatively, with feedback to a controller which automatically controls operation of shutoff valves V1 and V2.

While the first liquid container 108 is in use, valve V1 is in the open position and valve V2 is in the closed position. Once the minimum liquid level has been detected in the first liquid container, flow therefrom is ceased by closing valve V1, and valve V2 is opened to begin supply from the second, fresh container 110. The first container can then be replaced with a full container without, disrupting the process. Chemical depletion and switchover to a fresh container can continue in this manner, thereby allowing continuous supply of the chemical to the saturation vessel without interruption.

Figure 2:
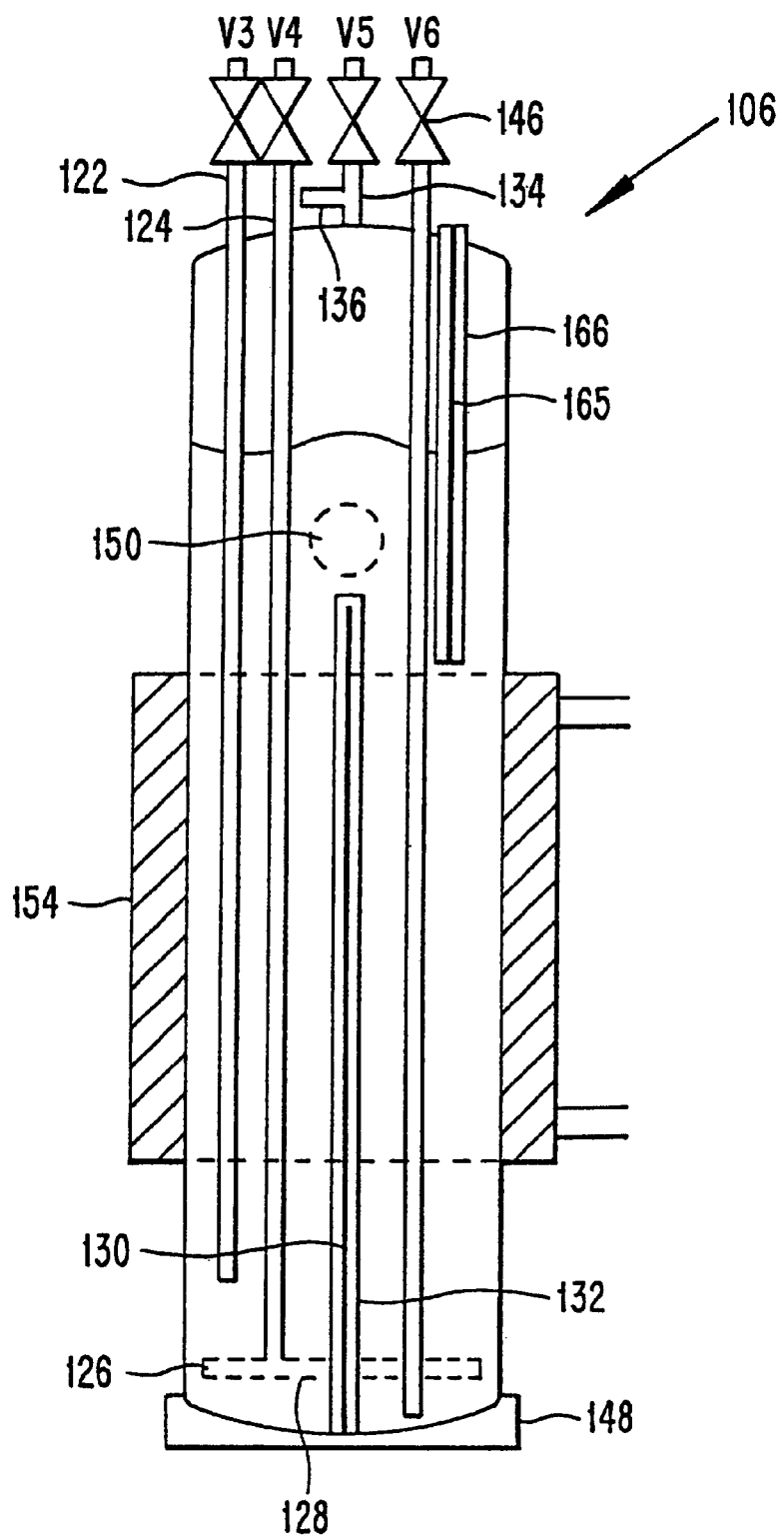
FIG. 2 illustrates a saturation vessel in accordance with one aspect of the invention.

With reference to FIG. 2, saturation vessel 106 is a vessel which contains the liquid chemical and has connections for introducing and removing various fluids. The size of the saturation vessel depends on the number of processing tools being serviced thereby, and the requirements of those tools. Typically, the saturation vessel has a liquid storage capacity of from 11.4 to 151.4 liters (3 to 40 gallons), and preferably from 56.8 to 94.6 liters (15 to 25 gallons), although other sizes can readily be used. In accordance with an exemplary aspect of the invention, the saturation vessel has an approximately 75.7 liter (20 gallon) liquid storage capacity.

Various connections on the saturation vessel are preferably disposed at a top portion thereof. A first connection 122 is connected to the liquid supply system described above, for introducing the liquid chemical into the saturation vessel. The first connection 122 includes a manual valve V3 connected to a tube which penetrates through the top of the saturation vessel and extends nearly to the vessel bottom. Preferably, the tube extends to within a few inches of the vessel bottom.

Second connection 124 is connected by tubing to the carrier gas supply 102 for introducing the carrier gas into the saturation vessel. Second connection 124 includes a manual valve V4 connected to a tube which penetrates through the top of the saturation vessel. The end of the tube of second connection 124 is connected to a gas dispersing structure 126 which has perforations through which the carrier gas flows and is dispersed into the liquid chemical. Preferably, the dispersing structure 126 includes a plurality of sintered metal tubes and is disposed at or near the bottom of the saturation vessel. The gas dispersing structure permits fine bubbles to be produced in the liquid chemical to allow intimate contact between the carrier gas and the liquid chemical.

Figure 3B:
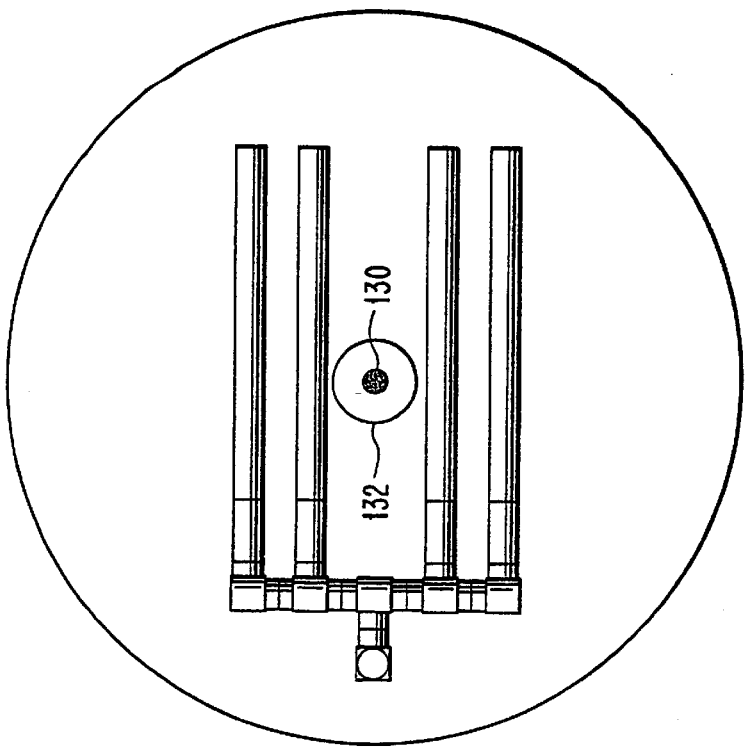
FIGS. 3A and 3B illustrate, in plan view, exemplary sparger assemblies for bubbling a carrier gas into the liquid chemical in accordance with one aspect of the invention.
Figure 3A:
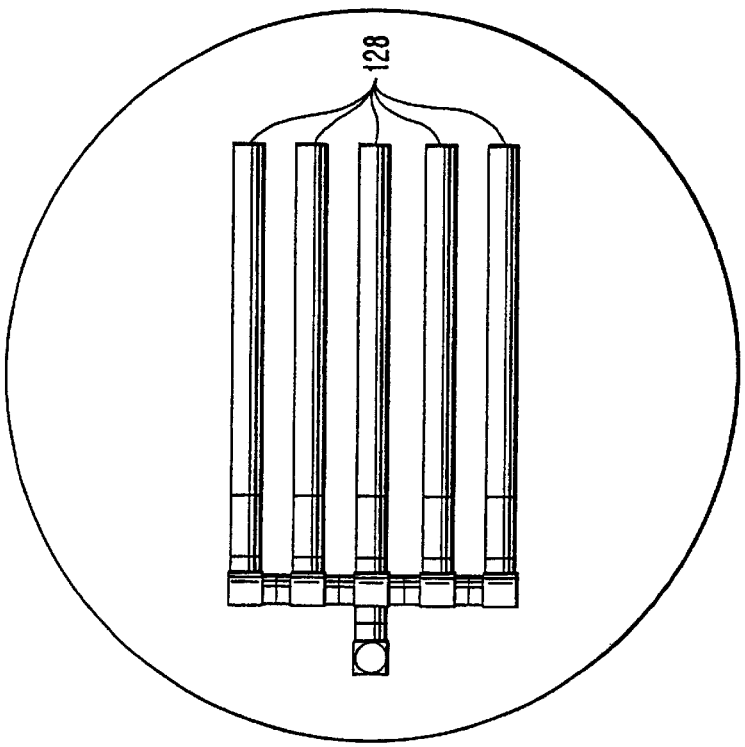

FIGS. 3A and 3B illustrate in plan view exemplary sparger assemblies which can be employed as the gas dispersing structure. While not being limited in any way thereto, FIG. 3A shows a sparger assembly which has five sintered metal tubes 128. In accordance with a preferred aspect of the invention and as shown in FIG. 3B, a heater 130 in a heater well 132 (described below) is disposed along the central axis of the saturation vessel. In such a case, no metal tube is present at the central axis.

As the carrier gas is introduced into the liquid chemical, bubbles pass up through the liquid chemical, eventually becoming saturated with the chemical vapor. The saturated vapor is removed from the saturation vessel through a third connection 134 which includes a manual valve V5 and tube which is connected to but typically does not extend into the saturation vessel. The diameter of this tube is designed to minimize pressure drop to avoid condensation of the chemical vapor.

Third connection 134 can further be provided with a pressure relief assembly 136 which protects the saturation vessel in the event of a high pressure condition. The pressure relief assembly advantageously can be serviced without removing the saturation vessel from service.

The saturated vapor exiting the saturation vessel is conducted through tubing 138 to the point of use, for example, one or more semiconductor processing tools. The tubing can be divided downstream into a plurality of branch lines 140, 142 and 144 for this purpose. One of the branch lines can optionally be connected to an analytical tool, such as a concentration sensor, for verification of the saturated gas product.

The saturation vessel preferably includes a fourth connection 146 which allows one to remove any remaining liquid chemical from the vessel when the vessel is to be serviced. The fourth connection 146 includes a manual valve V6 connected to tubing which penetrates through the top of the saturation vessel and extends to the bottom of the vessel. The liquid can be removed through this tubing by pressurizing the head space of the saturation vessel by use of a blow down line (not shown) connected to an inert gas supply or by backfilling the vessel through third connection 134.

To ensure a substantially constant vapor/liquid contact time between the carrier gas and liquid chemical, it is important that the liquid chemical in the saturation vessel be maintained at a substantially constant level. The liquid level can be controlled by various means. In accordance with an exemplary aspect of the invention, the liquid content in the saturation vessel is preferably controlled by monitoring the mass or weight of the saturation vessel. For this purpose, a mass or weight scale 148 can be disposed beneath the saturation vessel to continuously measure the mass or weight of the vessel. A signal from scale 148 is sent to a controller 150 which controls operation of the liquid supply system based on the weight measurement. Controller 150 sends a signal to a valve 152 which continuously controls the flux of liquid introduced into the saturation vessel to maintain a constant liquid level therein.

As an extra safety check in the event scale 148 malfunctions, liquid level sensors, for example, float switches, to detect high and/or low liquid levels in the saturation vessel can be installed. These sensors can be connected to an alarm system to alert the operator of any abnormal condition.

To allow visual monitoring and observation of the liquid level and dispersion of the carrier gas in the liquid chemical, a sight glass assembly 150 can be installed in the vessel. The sight glass assembly should be leak proof so as to avoid leakage and contamination of the liquid chemical. The sight glass is preferably constructed of a quartz lens sealed with an o-ring.

To prevent condensation of the chemical vapor in the saturated gas, the liquid chemical in the saturation vessel is cooled to a desired temperature below ambient temperature. The temperature setpoint will depend on the characteristics, such as vapor pressure, of the liquid chemical. As long as the temperature in the gas lines between the saturation vessel and the point of use is not less than the temperature of the liquid chemical in the vessel, condensation will not occur.

Two systems are employed to accurately control the temperature of the liquid chemical in the saturation vessel to the desired value. A first system allows the liquid chemical to be cooled in a controlled manner. An external cooling unit 154 in heat transfer contact with the saturation vessel is provided. The external cooling unit preferably takes the form of a cooling jacket around the saturation vessel through which a chilled heat transfer fluid is circulated, for example, by a fluid circulation pump 156. Suitable heat transfer fluids are known in the art and include, for example, ethylene glycol.

To maintain the heat transfer fluid at a precise temperature, the fluid passes through a condenser 158 in which it is brought into heat transfer contact with a circulating refrigerant which provides the cooling duty. The refrigerant forms a part of a refrigeration loop which also includes a precision chiller 160 and controller 162 for cooling the warmed refrigerant in line 164 of the refrigeration loop. The freshly cooled refrigerant from chiller 160 is introduced to the condenser via line 162 of the refrigeration loop. Suitable chillers and controllers are commercially available, for example, from Neslab Instruments, Inc., such as the model CFT-33 chiller with integrated controller.

Control of the heat transfer fluid temperature can be accomplished by known methods. For example, the temperature of the heat transfer fluid can be measured with a temperature sensor T1 in the condenser outlet line 163, with feedback to the chiller controller 162 which can adjust the cooling duty provided.

Where plural saturation vessels are employed, additional cooling systems can be provided for each saturation vessel. Alternatively, as shown in FIG. 1, the same cooling system can serve the plural saturation vessels 106', 106".

The cooling system described above is not, however, sufficient by itself to completely control the temperature. During the saturation process, conversion of the liquid chemical to a vapor results in the removal of additional heat from the liquid, the net effect being a drop in temperature which may be below the control temperature of the coolant. Because the chiller unit only provides cooling duty, this additional heat removal cannot be compensated for by the cooling system alone.

It is, therefore, desirable to provide a heater 130 for heating the liquid chemical to compensate for the heat removed during the liquid chemical vaporization process. To accommodate heater 130, a heater well 132 is provided in the saturation vessel. Heater 130 heats the liquid chemical when necessary and, together with the cooling system described above, maintains the liquid chemical at the desired temperature. The heater preferably includes a resistance type heating element, although other heater types can be used.

In accordance with an exemplary aspect of the invention, the heating element is contained within a well 132 which extends vertically from the bottom of the saturation vessel through the liquid chemical. The well can be constructed of stainless steel and is preferably cylindrical in shape. The heater preferably extends from the bottom center of the vessel to a height greater than half of the liquid level, more preferably to a height greater than three quarters of the liquid level, and most preferably to a height equal to the liquid level. This allows for adequate heat transfer with the liquid chemical to compensate for temperature fluctuations in a relatively fast manner. Because the heater is generally coextensive with the cooling unit, axial temperature fluctuations in the liquid chemical can advantageously be avoided.

To achieve greater heat transfer between the heating element and the liquid chemical, it has been found that a high temperature heat transfer fluid other than air in the heater well and in contact with the heater is beneficial. The heat transfer fluid is preferably an oil, such as a mineral oil. Mineral oils can typically reach temperatures ranging from about 54.4° C. (130° F.) to about 71.1° C. (160° F.).

The temperature of the liquid chemical in the saturation vessel can be monitored with a temperature sensor 165 disposed in a thermowell 166 in a port in the saturation vessel. Thermowell 166 extends into the liquid region of the vessel to provide an accurate temperature reading. The temperature sensor 165 sends a signal to a controller 168 which, in turn, sends a control signal to heater 130 to control operation thereof. Heater 130 turns on or off depending on the signal received from controller 168 to maintain a constant liquid temperature.

Another feature of the present invention lies in the control of the pressure of the carrier gas entering the saturation vessel. The pressure of the carrier gas and that of the saturated gas mixture are monitored by pressure sensors P1, P2, such as pressure transducers, in the carrier gas line 104 and in the saturated gas line 138, respectively. Signals from these sensors are sent to a pressure controller 170 which controls, for example, based on a cascade algorithm, a pressure regulator 172 on the carrier gas line to adjust the pressure of the carrier gas entering the saturation vessel. Other control schemes can alternatively be used. For example, the regulator can be controlled based on a signal from a single pressure sensor on the saturated gas line 138. Controller 170 is preferably an electronic pressure controller connected to a pneumatically operated regulator, as this offers fast response to pressure fluctuations, thereby minimizing deviation from the pressure setpoint, in contrast to manually operated mechanical pressure regulators. Suitable controllers are conventionally available, for example, from Tescom Corporation, such as the model ER 3000U Electropneumatic PID Controller.

The saturation vessel is preferably connected by flexible hoses to a valve panel which incorporates the tubing, valves, pressure sensing devices and other components allowing for centralized and easy operation of the system. Operations which can be controlled at the valve panel include, for example, the addition of liquid to the saturation vessel, monitoring and control of carrier gas and saturated gas pressure, flow control of the saturated gas, and venting and purging of the system for servicing.

As described above, a single saturation vessel can be connected to a plurality of processing tools by the valve and distribution system to serve as a saturated gas source for each tool. In such a case, the piping and components of the saturation system should be selected and sized to minimize pressure drop from the saturation vessel to the processing tools.

Typical semiconductor processing tools which can be used with the invention include, for example, chemical vapor deposition, diffusion and oxidation systems. In accordance with an exemplary aspect of the invention, the saturated vapor is introduced into an epitaxial reactor. In the epitaxial process, hydrogen can be used as the carrier gas and trichlorosilane as the liquid chemical. In such a process, a mineral oil in heater well 132 is preferably maintained at about 65.6° C. (150° F.), and the pressure of the hydrogen carrier gas at about $2.05 \times 10^5$ to $2.74 \times 10^5$ Pa (15 to 25 psig), more preferably about $2.25 \times 10^5$ to $2.53 \times 10^5$ Pa (18 to 22 psig). Under these conditions, the trichlorosilane vaporizes at about 15.6° C. (60° F.). Since the ambient room temperature is about 22.2° C. (70° F.), condensation of the vapor in the lines downstream of the saturation vessel leading to the semiconductor processing tool can be avoided.

Figure 4:
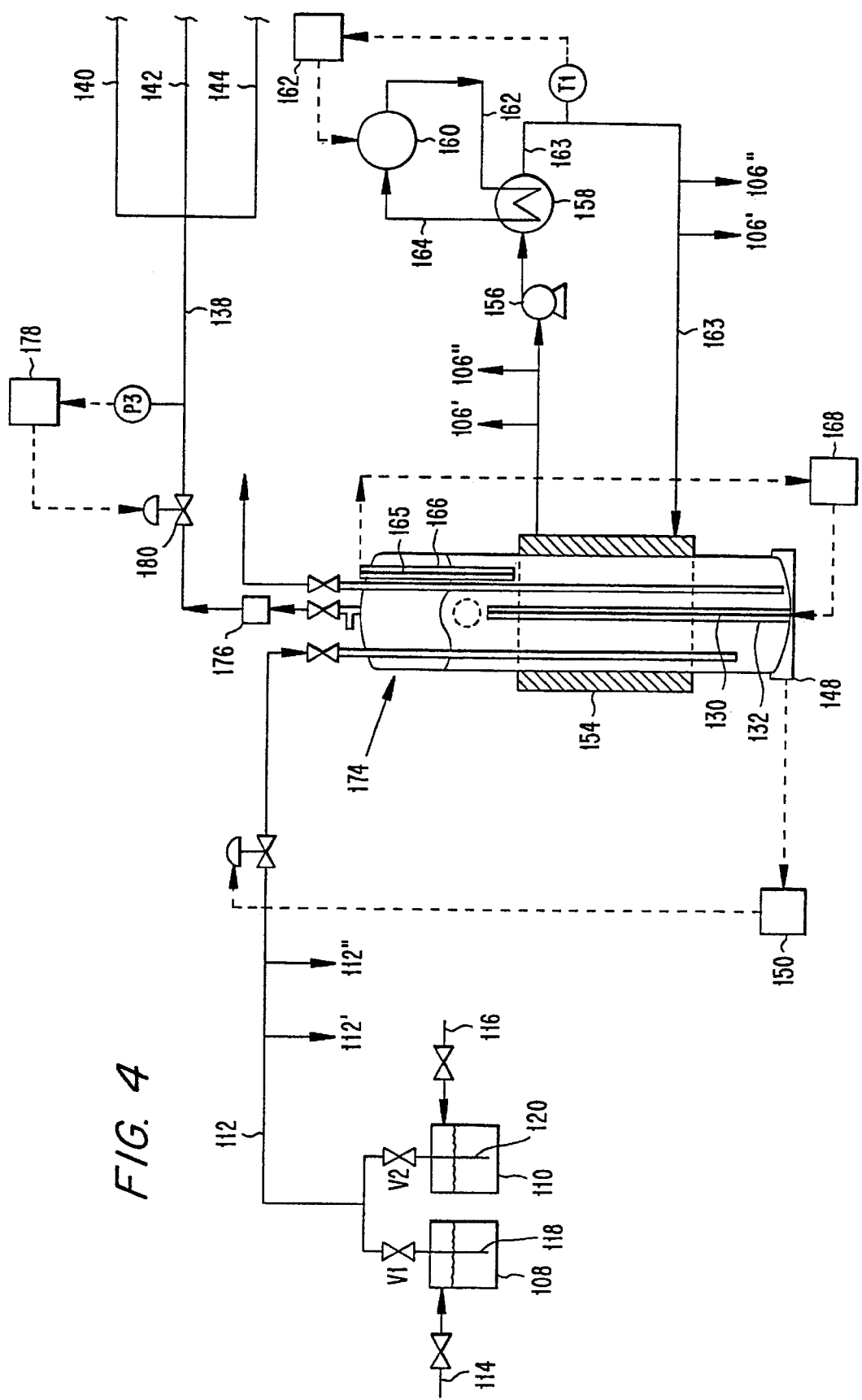
FIG. 4 illustrates an exemplary process flow diagram for controlled delivery of a vaporized chemical in accordance with a further aspect of the invention.

FIG. 4 illustrates a further aspect of the invention, which is a system and method for controlled delivery of a gas from a liquid chemical which is carrier gas-free. The descriptions of the features referenced by the same numerals as in FIG. 1 apply also to this embodiment.

Because this embodiment is carrier gas-free, the gas withdrawn from the liquid holding vessel through line 138 is 100% vapor from the liquid chemical. In place of the saturation vessel described above with reference to the gas saturation system, a liquid chemical evaporation vessel 174 is employed. Evaporation vessel 174 is different from the above-described saturation vessel in that the second connection for the carrier gas and the gas dispersing means described above are not present. The temperature control system, through the heating and cooling systems, maintains a constant temperature in the vessel, thereby establishing the vapor pressure in the headspace above the liquid.

The vapor preferably passes through a mist eliminator 176 on the exit side of the evaporation vessel to ensure single phase flow of the vapor stream from the evaporation vessel. Preferably, the mist eliminator is a sintered metal element through which the chemical vapor passes, although other devices are known to persons skilled in the art.

To fine tune the delivery pressure of the product vapor, the pressure of the product vapor from the headspace is monitored and controlled by a pressure sensor P3 in outlet line 138, with feedback to a pressure controller 178 which controls pressure regulator 180. Controller 178 is preferably an electronic pressure controller connected to a pneumatically operated regulator 180.

While the invention has been described in detail with reference to specific embodiments thereof, it will be apparent to one skilled in the art that various changes and modifications can be made, and equivalents employed without departing from the scope of the claims.

What is claimed is:

1. A system for controlled vaporization of a liquid chemical, comprising:

(a) an evaporation vessel connected to receive a liquid chemical and which is carrier gas-free;

(b) means for maintaining the liquid chemical in the evaporation vessel at a substantially constant level; and (c) means for controlling the temperature of the liquid chemical in the evaporation vessel to a desired value, the controlling means comprising (I) a system for cooling the liquid chemical, and (ii) a heater inside the evaporation vessel for heating the liquid chemical.

2. The system according to claim 1, wherein the heater comprises a heating element surrounded by a liquid heat transfer fluid, the heating element and heat transfer fluid being separated from the liquid chemical.

3. The system according to claim 1, wherein the heater extends vertically in the liquid a distance at least half of the height of the liquid chemical level.

4. The system according to claim 1, wherein the system for cooling comprises a cooling jacket around the evaporation vessel having a liquid cooling fluid circulating therethrough.

5. The system according to claim 1, wherein the means for maintaining the liquid chemical level comprises a weight or mass scale disposed beneath the evaporation vessel and a controller for controlling flow of the liquid chemical to the evaporation vessel based on the weight or mass measurement from the scale.

6. A method of controlled delivery of a vaporized liquid chemical which is carrier gas-free, comprising the steps of:

(a) introducing a liquid chemical into an evaporation vessel;

(b) maintaining the liquid level in the evaporation vessel at a substantially constant level; and (c) controlling the temperature of the liquid chemical in the evaporation vessel to a desired sub-ambient value by cooling the liquid chemical to the desired value, and adding heat to the liquid chemical, as necessary to adjust the temperature, with a heater inside the saturation vessel; and (d) removing a stream of vaporized liquid chemical from the evaporation vessel.

7. The method according to claim 6, wherein the heater comprises a heating element surrounded by a liquid heat transfer fluid, the heater and heat transfer fluid being separated from the liquid chemical.

8. The method according to claim 7, wherein the liquid chemical cooling comprises circulating a liquid cooling fluid through a cooling jacket around the saturation vessel.

9. The method according to claim 7, wherein the maintaining of the liquid chemical level comprises measuring the weight or mass of the evaporation vessel and controlling flow of the liquid chemical to the evaporation vessel based on the weight or mass measurement.

10. The method according to claim 6, wherein the heater is inside the saturation vessel and extends vertically in the liquid a distance at least half of the height of the liquid chemical level.

* * * * *